(12) United States Patent
Soer

(10) Patent No.: US 11,289,630 B2
(45) Date of Patent: Mar. 29, 2022

(54) TUNABLE LIGHTING SYSTEM WITH PREFERRED COLOR RENDERING

(71) Applicant: Lumileds LLC, San Jose, CA (US)

(72) Inventor: Wouter Soer, Utrecht (NL)

(73) Assignee: Lumileds LLC, San Jose, CA (US)

( * ) Notice: Subject to any disclaimer, the term of this patent is extended or adjusted under 35 U.S.C. 154(b) by 82 days.

(21) Appl. No.: 16/723,265

(22) Filed: Dec. 20, 2019

(65) Prior Publication Data

US 2021/0193882 A1 Jun. 24, 2021

(51) Int. Cl.
*H01L 33/50* (2010.01)
*H05B 45/20* (2020.01)
*H01L 25/075* (2006.01)

(52) U.S. Cl.
CPC ........ *H01L 33/504* (2013.01); *H01L 25/0753* (2013.01); *H05B 45/20* (2020.01)

(58) Field of Classification Search
None
See application file for complete search history.

(56) References Cited

U.S. PATENT DOCUMENTS

| | | | |
|---|---|---|---|
| 7,518,149 B2 | 4/2009 | Maaskant et al. | |
| 8,604,702 B2 | 12/2013 | Bertram | |
| 8,760,074 B2 | 6/2014 | Raj et al. | |
| 8,901,845 B2 | 12/2014 | Pickard et al. | |
| 9,468,069 B2 | 10/2016 | Lee | |
| 9,560,714 B1 | 1/2017 | Hjerde | |
| 9,865,577 B2 | 1/2018 | Bibl et al. | |
| 9,876,141 B2 | 1/2018 | Lopez | |
| 9,890,911 B2 | 2/2018 | Soer et al. | |
| 9,921,428 B2 | 3/2018 | Van De Ven | |
| 10,090,437 B2 | 10/2018 | Timmering et al. | |
| 10,355,168 B2 | 7/2019 | Lopez | |
| 10,400,958 B2 | 9/2019 | Vampola | |
| 10,756,242 B2* | 8/2020 | Estrada | H01L 33/62 |
| 10,837,607 B2* | 11/2020 | Soer | H01L 33/507 |
| 2011/0102704 A1* | 5/2011 | Dunn | H01L 33/504 |
| | | | 349/61 |
| 2015/0171284 A1* | 6/2015 | Bechtel | H01L 33/504 |
| | | | 257/98 |
| 2016/0004005 A1* | 1/2016 | Namekata | G02B 6/0068 |
| | | | 349/65 |

(Continued)

FOREIGN PATENT DOCUMENTS

CN 109216333 A 1/2019

OTHER PUBLICATIONS

Shenzhen Smalite Optoelecronics Co Ltd, CN109216333A,EPO Machine Translation XML, 8 pages.

(Continued)

*Primary Examiner* — Crystal L Hammond

(57) ABSTRACT

Light emitting devices having a first LED with a first phosphor, a second LED with a second phosphor and a third LED with a third phosphor to emit a composite white light are described. The first LED and first phosphor emit the red spectral component, the second LED and the second phosphor emit the blue spectral component and the third LED and third phosphor emit the green spectral component of the composite white light. The green spectral component has at least 30% radiant flux in a deep red spectral wavelength region.

20 Claims, 5 Drawing Sheets

(56) References Cited

U.S. PATENT DOCUMENTS

2019/0148605 A1* 5/2019 Mu .................. H01L 33/50
257/98
2019/0371976 A1 12/2019 Kessels et al.

OTHER PUBLICATIONS

From the EPO as the ISA, Notification of Transmittal of the International Search Report and the Written Opinion of the International Searching Authority, or the Declaration, corresponding to PCT/US2020/064065, dated Mar. 12, 2021, 11 pages.
ANSI/IES TM-30-18 "Method for Evaluating Light Source Color Rendition", (2018), 34 pages.
"TracePro's accurate LED source modeling improves the performance of optical design simulations.", Lambda Research Corporation, Technical Article, Mar. 2015, 13 pages.
Liu, Zongyuan , et al., "Precise optical modeling of blue light-emitting diodes by Monte Carlo ray-tracing", Optics Express, Apr. 26, 2010, vol. 18, No. 9, pp. 9398-9412.
Royer, Ph.D., Michael , "TM 30: What have we learned in the past two years?", U.S. Department of Energy, Office of Energy Efficiency and Renewable Energy, Sep. 12, 2017, 48 pages.
European Search Report in 2019P00049EP01, dated Jul. 16, 2020, 8 pages.
Extended European Search Report, corresponding to EP20155176.9, dated Jul. 16, 2020, 8 page.

* cited by examiner

TUNABLE LIGHTING SYSTEM WITH PREFERRED COLOR RENDERING

TECHNICAL FIELD

Embodiments of the present disclosure generally relate to light emitting diode (LED) devices and methods for making the same. In particular, embodiments of the disclosure are directed to light emitting diode (LED) devices with high color fidelity.

BACKGROUND

A light emitting diode (LED) is a semiconductor light source that emits visible light when current flows through it. LEDs combine a P-type semiconductor with an N-type semiconductor to form a device that emits light. LEDs commonly use a group III-V compound semiconductor which provides stable operation at a higher temperature than devices that use other semiconductors. The group III-V semiconductors compound is typically formed on a substrate formed of sapphire aluminum oxide ($Al_2O_3$) or silicon carbide (SiC).

An LED can be combined with a "phosphor" to produce light with increased longer wavelength components. A phosphor, as used herein, refers to a material that converts or modifies the spectral power distribution of the LED. For example, an LED exhibiting a blue spectral range can be converted using a phosphor to convert the shorter wavelength blue light into longer wavelength (e.g., green or red wavelengths) to change the overall observed color. A phosphor absorbs some of the light from the LED causing electrons to be promoted to unstable energy levels. When the excited state electrons relax to the ground state, energy in the form of light is emitted. The emitted light has a lower energy (longer wavelength) than the light initially absorbed by the phosphor. A phosphor may also be referred to as a wavelength modifying component or composition.

The amount of light absorbed and emitted by the phosphor depends on, inter alia, the composition of the phosphor material and/or the concentration of phosphor material. The devices can be constructed so that all of the light emitted by the LED is absorbed by the phosphor material. The device, therefore, can be configured to emit light in a narrow range of wavelengths. A device could alternatively be configured to absorb less than all of the light from the LED so that the emitted light is a mixture of wavelengths from the LED and from the phosphor. By changing the concentration and/or phosphor material species, the color of the light can be tuned.

Color tuning with desaturated red, green and blue phosphor-converted LEDs is an effective approach to achieving high efficacy and flux of white light over a wide correlated color temperature (CCT) range while also providing high color fidelity.

In many lighting applications, the desired color rendering performance is often one that gives the highest subjective preference rather than one that give the highest color fidelity. Numerous studies have shown that preference correlates more with red saturation than with general color fidelity, once the latter has passed a certain threshold. There is a need for light emitting devices with tuned color profiles for improved high fidelity color.

SUMMARY

Devices herein are light emitting diode (LED) devices with preferred color rendering. One or more embodiments of the disclosure are directed to light emitting diode (LED) devices. The light emitting devices comprise a first LED and a first phosphor configured to emit a red spectral component of a composite white light. A second LED and a second phosphor are configured to emit a blue spectral component of the composite white light. A third LED and a third phosphor are configured to emit a green spectral component of the composite white light.

The green spectral component may have at least 30% of total radiant flux in a wavelength range of 630 nm to 780 nm. In some embodiments, the green spectral component has at least 30% of total radiant flux in the wavelength range of 630 nm to 780 nm.

The third phosphor may be configured to provide a green spectral component having an $R_{cs,h1}$ greater than or equal to −5% by TM-30-18. In some embodiments, the third phosphor is configured to provide a green spectral component having an $R_{cs,h1}$ greater than or equal to −5% by TM-30-18.

The red, blue and green spectral components may have an excitation purity less than 0.95. In some embodiments, each of the red spectral component, blue spectral component and green spectral component has an excitation purity less than 0.95. The red spectral component may have an excitation purity in the range of 0.8 to 0.94. The green spectral component may have an excitation purity in the range of 0.8 to 0.94. The blue spectral component may have an excitation purity in the range of 0.4 to 0.5. In some embodiments, the red spectral component and green spectral components each have an excitation purity in the range of 0.8 to 0.94, and the blue spectral component has an excitation purity in the range of 0.4 to 0.5.

The composite white light may have a color rendering index (CRI) with Ra greater than or equal to 90 and R9 greater than or equal to 50. The composite white light may have a TM-30-18 gamut index (Rg) greater than or equal to 100 over a target correlated color temperature (CCT) range of 2700 K to 6500 K. The composite white light may have a TM-30-18 chroma shift for hue bin 1 ($R_{cs,h1}$) in the range of 0% to 15% over the target CCT range. In some embodiments, the composite white light has a color rendering index (CRI) with Ra greater than or equal to 90 and R9 greater than or equal to 50. In some embodiments, the composite white light has a TM-30-18 gamut index (Rg) greater than or equal to 100 over a target correlated color temperature (CCT) range of 2700 K to 6500 K. In some embodiments, the composite white light has a TM-30-18 chroma shift for hue bin 1 ($R_{cs,h1}$) in the range of 0% to 15% over the target CCT range.

One or more of the first LED, the second LED or the third LED may be configured to emit royal-blue light. In some embodiments, each of the first LED, the second LED and the third LED are configured to emit royal-blue light.

The red spectral component may have a maximum intensity at a wavelength greater than 600 nm in a wavelength range of 380 nm to 780 nm. The blue spectral component may have a maximum intensity at a wavelength less than 500 nm in a wavelength range of 380 nm to 780 nm. In some embodiments, the red spectral component comprises light having a maximum intensity at a wavelength greater than 600 nm in a wavelength range of 380 nm to 780 nm, and the blue spectral component comprises light having a maximum intensity at a wavelength less than 500 nm in a wavelength range of 380 nm to 780 nm.

There may be a plurality of RGB LED groups. Each RGB LED group may have a first LED, first phosphor, second LED, second phosphor, third LED and third phosphor. In some embodiments, there are a plurality of RGB LED groups, each RGB LED group comprising the first LED, the first phosphor, the second LED, the second phosphor, the third LED, and the third phosphor.

The first LED and first phosphor may be contained within a first LED package. The second LED and the second phosphor may be contained within a second LED package. The third LED and the third phosphor may be contained within a third LED package. The first LED packages may be connected in series. The second LED packages may be connected in series. The third LED packages may be connected in series. The first LED packages connected in series, the second LED packages connected in series and the third LED packages connected in series may share a common cathode. In some embodiments, each of the first LED and first phosphor are contained within a first LED package, each of the second LED and second phosphor are contained within a second LED package, and each of the third LED and third phosphor are contained within a third LED package. In some embodiments, each of the first LED packages are connected in series, each of the second LED packages are connected in series and each of the third LED packages are connected in series. In some embodiments, the first LED packages connected in series, the second LED packages connected in series and the third LED packages connected in series share a common cathode.

Additional embodiments of the disclosure are directed to light emitting devices comprising a first LED and first phosphor, a second LED and second phosphor, and a third LED and third phosphor. The first LED and first phosphor may be configured to emit an unsaturated red spectral component of a composite white light. The second LED and second phosphor may be configured to emit an unsaturated blue spectral component of the composite white light. The third LED and third phosphor may be configured to emit an unsaturated green spectral component of the composite white light. The third phosphor may include a green phosphor configured to add deep red spectral wavelengths to light emitted from the third LED. The green spectral component may have at least 30% of total radiant flux in a wavelength range of 630 nm to 780 nm. The composite white light may have a color rendering index (CRI) with Ra greater than or equal to 90. The composite white light may have a TM-30-18 chroma shift for hue bin 1 ($R_{cs,h1}$) in the range of 0% to 15% over the target CCT range.

Some embodiments of the disclosure are directed to light emitting devices comprising a first LED and first phosphor, a second LED and second phosphor, and a third LED and third phosphor. The first LED and first phosphor are configured to emit an unsaturated red spectral component of a composite white light. The second LED and second phosphor are configured to emit an unsaturated blue spectral component of the composite white light. The third LED and third phosphor are configured to emit an unsaturated green spectral component of the composite white light. The third phosphor comprises a green phosphor configured to add deep red spectral wavelengths to light emitted from the third LED. The green spectral component has at least 30% of total radiant flux in a wavelength range of 630 nm to 780 nm. The composite white light has a color rendering index (CRI) with Ra greater than or equal to 90, and a TM-30-18 chroma shift for hue bin 1 ($R_{cs,h1}$) in the range of 0% to 15% over the target CCT range.

Further embodiments of the disclosure are directed to light emitting devices. The light emitting devices may include a plurality of first LEDs and first phosphors configured to emit a red spectral component of a composite white light. Each of the first LEDs may be connected in series. The light emitting devices may include a plurality of second LEDs and second phosphors configured to emit a blue spectral component of the composite white light. Each of the second LEDs may be connected in series. The light emitting devices may include a plurality of third LEDs and third phosphors configured to emit a green spectral component of the composite white light. The green spectral component may have at least 30% radiant flux present in a wavelength range of 630 nm to 780 nm. Each of the third LEDs may be connected in series. The light emitting device may include a controller configured to independently control an input power for the plurality first LEDs, the plurality of second LEDS and/or the plurality of third LEDs.

Some embodiments of directed to light emitting devices comprising a plurality of first LEDs and first phosphors, a plurality of second LEDs and second phosphors, a plurality of third LEDs and third phosphors and a controller. The plurality of first LEDs and first phosphors are configured to emit a red spectral component of a composite white light, each of the first LEDs connected in series. The plurality of second LEDs and second phosphors are configured to emit a blue spectral component of the composite white light, each of the second LEDs connected in series. The plurality of third LEDs and third phosphors are configured to emit a green spectral component of the composite white light. The green spectral component comprises at least 30% radiant flux present in a wavelength range of 630 nm to 780 nm, each of the third LEDs connected in series. The controller is configured to independently control an input power for the plurality of first LEDs, the plurality of second LEDS and the plurality of third LEDs.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Some embodiments of the disclosure advantageously modify the green primary of a high color fidelity system, without changing the red primary and blue primary. In one or more embodiments, the green primary is changed by adding deep red spectral content through a narrow red phosphor such as SLA (SrLiAl$_3$N$_4$:Eu$^{2+}$), while maintaining a substantially green color point. In some embodiments, the deep red spectral content is added to the green and one or more of the red or blue primaries.

In one or more embodiment of the disclosure, the green primary spectrum is changed by adding deep red spectral content through a narrow red down-converter. In some embodiments, the green primary has high utilization throughout the CCT tuning range and thus contributes significantly to the composite white spectrum at any CCT. The narrow red down-converter may be a phosphor such as SLA, a potassium silicon fluoride (KSiF) compound, or a quantum dot down-converter. In some embodiments, the deep red spectral content of the green primary is characterized by having at least 30% of radiant flux present in the wavelength range of 630 nm to 780 nm. In some embodiments, the deep red spectral content of the green primary is characterized as having an $R_{cs,h1}$ greater than −5%, based on TM-30-18.

In some embodiments, the narrow red down-converter comprises quantum dots. Quantum dots comprise particles that can be configured to emit light of specific wavelengths which can be tuned by changing various properties of the particles, for example, composition, shape and size. In some embodiments, the quantum dots emit at a peak wavelength in the range of 630 nm to 660 nm.

Figure 1:
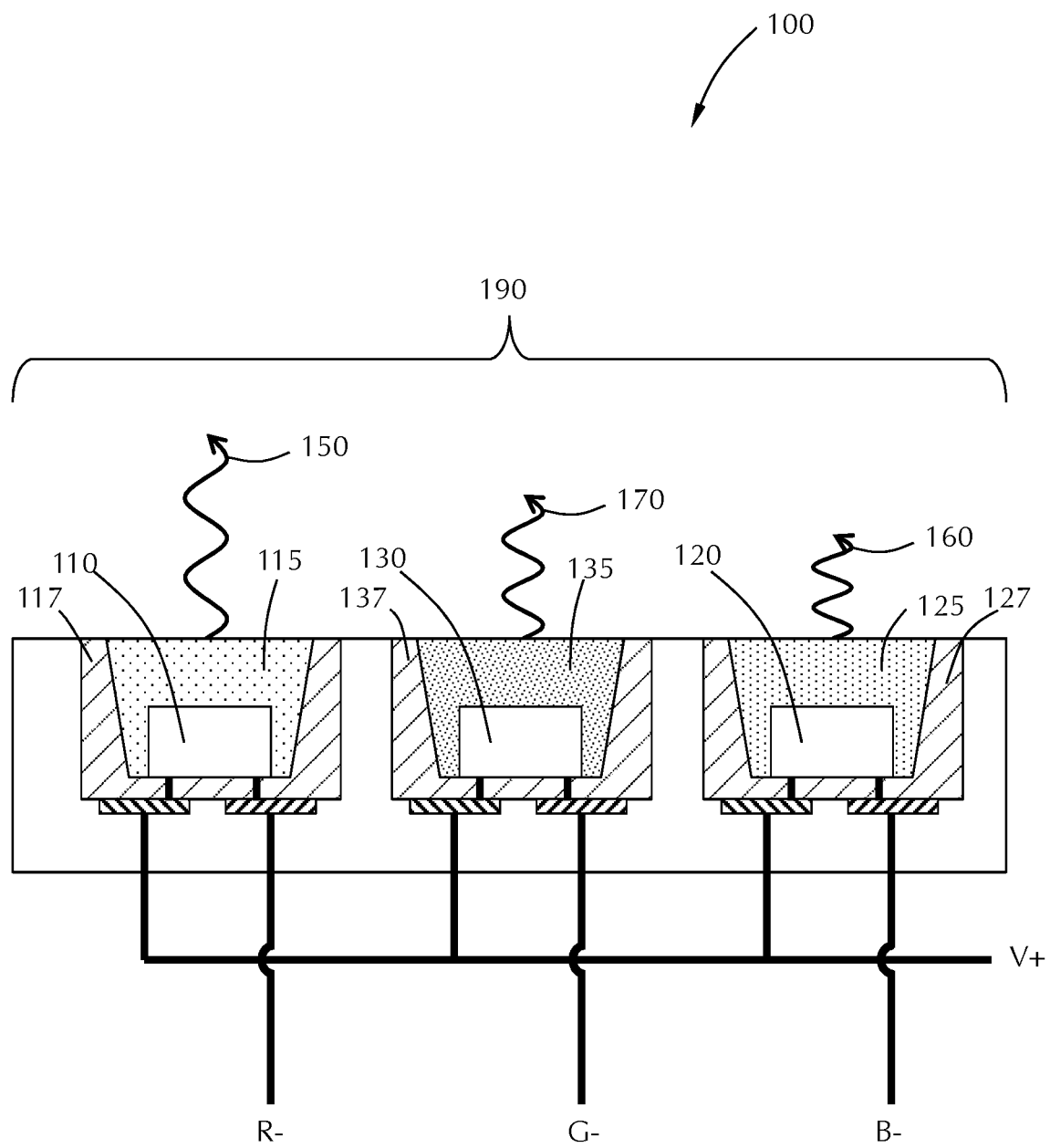
FIG. 1 illustrates an exemplary light emitting device according to one or more embodiment of the disclosure.

Accordingly, with reference to FIG. 1, one or more embodiments of the disclosure are directed to light emitting devices 100. The device 100 comprises a first LED 110 and a first phosphor 115, a second LED 120 and a second phosphor 125 and a third LED 130 and a third phosphor 135. The embodiment illustrated in FIG. 1 shows a single first LED 110, single first phosphor 115, single second LED 120, single second phosphor 125, single third LED 130 and single third phosphor 135. In some embodiments, there are more than one first LED 110, first phosphor 115, second LED 120, second phosphor 125, third LED 130 and third phosphor 135. In some embodiments, each of the first LEDs are electrically connected in series. In some embodiments, each of the second LEDs 120 are electrically connected in series. In some embodiments, each of the third LEDs 130 are electrically connected in series. In the embodiment illustrated in FIG. 1, the first LED 110 is on the left, the second LED 120 is on the right and the third LED 130 is in the middle. This arrangement of LEDs is merely representative of one possible configuration and should not be taken as limiting the scope of the disclosure.

The first LED 110 radiates light with an initial spectral component. The initial spectral component passes into and/or through the first phosphor 115. In some embodiments, a portion of the initial spectral component passes through the first phosphor 115. In some embodiments, substantially all of the initial spectral component is absorbed by the first phosphor 115. As used in this manner "substantially all" means that greater than or equal to about 95%, 98%, 99% or 99.5% of the initial spectral component is absorbed by the respective phosphor.

The first phosphor 115 comprises a composition that can absorb light from the initial spectral component and emit light with a modified spectral composition. As used in this manner, "a modified spectral composition" means that at least some of the wavelengths of light emitted in the visible spectrum from the stated LED are decreased in relative intensity and at least some of the wavelengths of light emitted from the stated LED in the visible spectrum are increased in relative intensity. The first phosphor 115 is configured to emit a red spectral component 150 of a composite white light 190.

The second LED 120 radiates light with an initial spectral component. The initial spectral component passes into and/or through the second phosphor 125. In some embodiments, the initial spectral component from the second LED 120 is substantially the same as the initial spectral component from the first LED 110. As used in this manner "substantially the same" means that the spectrum of the subject component has a peak wavelength and peak full width at half maximum (FWHM) both of which are within 5 nm of the peak wavelength and peak FWHM of the spectrum of the related component, respectively. In some embodiments, the initial spectral component from the second LED 120 is different than the initial spectral component from the first LED 110. In some embodiments, a portion of the initial spectral component from the second LED 120 passes through the second phosphor 125

The second phosphor 125 comprises a composition that can absorb light from the initial spectral component and emit light with a modified spectral composition. In some embodiments, the second phosphor 125 is configured to emit a blue spectral component 160 of a composite white light 190.

The third LED 130 radiates light with an initial spectral component. In some embodiments, the initial spectral component from the third LED 130 is substantially the same as the initial spectral component from one or more of the first LED 110 or the second LED 120. The initial spectral component passes into and/or through the third phosphor 135. In some embodiments, a portion of the initial spectral component passes through the third phosphor 135. In some embodiments, substantially all of the initial spectral component is absorbed by the third phosphor 135.

The third phosphor 135 comprises a composition that can absorb light from the initial spectral component and emit light with a modified spectral composition. In some embodiments, the third phosphor 135 is configured to emit a green spectral component 170 of a composite white light 190. In some embodiments, the third LED 130 and the third phosphor 135 are configured to emit a green spectral component 170 of the composite white light 190.

In some embodiments, the green phosphor is configured to provide a green spectral component 170 having at least 30% of the total radiant flux in a wavelength range of 630 nm to 780 nm. In some embodiments, the green spectral component 160 has a total radiant flux in the wavelength range of 630 nm to 780 nm of at least 25%, 27.5%, 30%, 32.5% 35%, 37.5%, 40%, 42.5%, 45%, 47.5% or 50%. In some embodiments, the green spectral component 160 has a total radiant flux in the wavelength range of 630 nm to 780 nm in the range of 25% to 60%, or in the range of 27.5% to 57.5%, or in the range of 30% to 55%, or in the range of 32.5% to 50%, or in the range of 35% to 47.5% or in the range of 37.5% to 45%.

In some embodiments, the third phosphor 135 (also referred to as the green phosphor) is configured to provide a green spectral component 170 having a local chroma shift in hue-angle bin 1 ($R_{cs,h1}$) greater than or equal to −5%, as measured by TM-30-18. In some embodiments, the green phosphor is configured to provide a green spectral component 170 having an $R_{cs,h1}$ value by TM-30-18 greater than or equal to −10%, −7.5%, −5%, −4%, −3%, −2%, −1%, 0%, 1%, 2%, 3%, 4%, 5%, 6%, 7%, 8%, or 9%. In some embodiments, the green phosphor is configured to provide a green spectral component 170 having an $R_{cs,h1}$ value by TM-30-18 in the range of −10% to 20%, or in the range of −5% to 17.5%, or in the range of 0% to 15%, or in the range of 0% to 10%.

Suitable examples of green phosphors include, but are not limited to, aluminum garnet phosphors with the general formula $(Lu_{1-x-y-a-b}Y_xGd_y)_3(Al_{1-z}Ga_z)_5O_{12}:Ce_aPr_b$ wherein 0<x<1, 0<y<1, 0<z≤0.1, 0<a≤0.2 and 0<b≤0.1, such as $Lu_3AlO_{12}:Ce^{3+}$ and $Y_3Al_5O_{12}:Ce^{3+}$, $LU_{3-x-y}M_yAl_{5-z}A_zO_{12}:Ce_x$ where M=Y, Gd, Tb, Pr, Sm, Dy; A=Ga, Sc; and (0<x≤0.2); $Ca_{3-x-y}M^PSc_{2-z}A_zSi_3O_{12}:Ce_x$ where M=Y, Lu; A=Mg, Ga; and (0<x≤0.2); $Ba_{2-x-y}M_ySiO_4:Eu_x$ where M=Sr, Ca, Mg and (0<x≤0.2); $Ba_{2-x-y-z}M_yK_zSi_{1-z}P_zO_4Eu_x$ where M=Sr, Ca, Mb and (0<x≤0.2); $Sr_{1-x-y}M_yAl_{2-z}Si_zO_{4-z}N_z:Eu_x$ where M=Ba, Ca, Mg and (0<x≤0.2); $M_{1-x}Si_2O_2N_2:Eu_x$ where M=Sr, Ba, Ca, Mg and (0<x≤0.2); $M_{3-x}Si_6O_9N_4:Eu_x$ where M=Sr, Ba, Ca, Mg and (0<x≤0.2); $M_{3-x}Si_6O_{12}N_2:Eu_x$ where M=Sr, Ba, Ca, Mg and (0<x≤0.2); $Sr_{1-x-y}M_yGa_{2-z}Al_zS_4:Eu_x$ where M=Ba, Ca, Mg and (0<x≤0.2); $Ca_{1-x-y-z}M_zS:Ce_xA_y$ where M=Ba, Sr, Mg; A=K, Na, Li; and (0<x≤0.2); $Sr_{1-x-z}M_zAl_{1+y}Si_{4-2-y}N_{7-y}O_{0.4+y}:Eu_x$ where M=Ba, Ca, Mg and (0<x≤0.2); $Ca_{1-x-y-z}M_ySc_2O_4:Ce_xA_z$ where M=Ba, Sr, Mg; A=K, Na, Li; and (0<x≤0.2); $M_{x-z}Si_{6-y-2x}Al_{y+2x}O_yN_{8-y}:Eu_z$ where M=Ca, Sr, Mg and (0<x≤0.2); and $Ca_{8-x-y}M_yMgSiO_4Cl_2:Eu_x$ where M=Sr, Ba and (0<x≤0.2).

Suitable examples of red phosphors include, but are not limited to, $Sr_{1-x-y}Ba_xCa_y)_{2-z}Si_{5-a}Al_aN_{8-a}O_a:Eu_z^{2+}$ wherein 0≤a<5, 0<x≤1, 0≤y≤1, and 0<z≤1, such as $Sr_2Si_5N_8:Eu^{2+}$; $Ca_{1-x-z}M_zS:Eu_x$ where M=Ba, Sr, Mg, Mn and (0<x≤0.2); $Ca_{1-x-y}M_ySi_{1-z}Al_{1+z}N_{3-z}O_z:Eu_x$ where M=Sr, Mg, Ce, Mn and (0<x≤0.2); $Mg_4Ge_{1-x}O_5F:Mn_x$ where (0<x≤0.2); $M_{2-x}Si_{5-y}Al_yN_{8-y}O_y:Eu_x$ where M=Ba, Sr, Ca, Mg, Mn and (0<x≤0.2); $Sr_{1-x-y}M_ySi_{4-z}Al_{1+z}N_{7-z}O_z:Eu_x$ where M=Ba, Ca, Mg, Mn and (0<x≤0.2); and $Ca_{1-x-y}M_ySiN_2:Eu_x$ where M=Ba, Sr, Mg, Mn and (0<x≤0.2).

Suitable examples of cyan, yellow, and/or red emitting phosphors further include, but are not limited to, $(Sr_{1-a-b}Ca_bBa_c)Si_xN_yO_z:Eu_a^{2+}$ (a=0.002-0.2, b=0.0-0.25, c=0.0-0.25, x=1.5-2.5, y=1.5-2.5, z=1.5-2.5) including, for example, $SrSi_2N_2O_2:Eu^{2+}$; $(Sr_{1-u-v-x}Mg_uCa_vBa_x)(Ga_{2-y-z}Al_yIn_zS_4):Eu^{2+}$ including, for example, $SrGa_2S_4:Eu^{2+}$; $Sr_{1-x}Ba_xSiO_4:Eu^{2+}$; and $(Ca_{1-x}Sr_x)S:Eu^{2+}$ wherein 0<x<1 including, for example, $CaS:Eu^{2+}$ and $SrS:Eu^{2+}$.

In certain embodiments, the green spectral component has at least 30% of the total radiant flux in a wavelength range of 630 nm to 780 nm, and a $R_{cs,h1}$ value by TM-30-18 in the range of 0% to 15%.

In some embodiments, each of the first LED 110, the second LED 120 and the third LED 130 are configured to emit royal-blue light. As used in this manner, the term "royal-blue light" refers to light with a peak wavelength between 440 nm and 460 nm.

In some embodiments, the red spectral component comprises light having a maximum intensity at a wavelength greater than 600 nm in a wavelength range of 380 nm to 780 nm. In some embodiments, the blue spectral component comprises light having a maximum intensity at a wavelength less than 500 nm in a wavelength range of 380 nm to 780 nm. In certain embodiments, the red spectral component comprises light with a maximum intensity at a wavelength greater than 600 nm and the blue spectral component comprises light with a maximum wavelength less than 500 nm, over the range of 380 nm to 780 nm.

In some embodiments, the composite white light 190 has an excitation purity less than 0.95 for the red spectral component, blue spectral component and green spectral component. The excitation purity a measure of the difference from the light source's white point to the furthest point on the chromaticity diagram with the same hue. Using the CIE 1931 color space, the excitation purity can be calculated by equation I.

$$p_e = \sqrt{\frac{(x-x_n)^2 + (y-y_n)^2}{(x_I - x_n)^2 + (y_I - y_n)^2}} \quad (I)$$

where $(x_n, y_n)$ is the chromaticity of the white point and $(x_I, y_I)$ is the point on the perimeter whose line segment to the white point contains the chromaticity of the stimulus.

In some embodiments, the excitation purity of the red spectral component is in the range of 0.7 to 0.98, or in the range of 0.75 to 0.96, or in the range of 0.8 to 0.94. In some embodiments, the excitation purity of the green spectral component is in the range of 0.7 to 0.98, or in the range of 0.75 to 0.96, or in the range of 0.8 to 0.94. In some embodiments, the excitation purity of the blue spectral component is in the range of 0.3 to 0.6, or in the range of 0.35 to 0.55, or in the range of 0.4 to 0.5. In some embodiments, the red spectral component has an excitation purity in the range of 0.8 to 0.94, the green spectral component has an excitation purity in the range of 0.8 to 0.94, and the blue spectral component has an excitation purity in the range of 0.4 to 0.5.

The composite white light according to one or more embodiment of the disclosure has a color rendering index (CRI) with Ra greater than or equal to 90 and an R9 greater than or equal to 50. In some embodiments, the composite white light has a CRI with Ra greater than or equal to 80, 85, 90 or 95. In some embodiments, the composite white light has a CRI with R9 greater than or equal to 0, 20, 50 or 80. In some embodiments, the composite white light has a CRI with Ra in the range of 80 to 100 and R9 in the range of 0 to 100.

In one or more embodiments, the composite white light has a TM-30-18 gamut index (Rg) greater than or equal to 100 over the target correlated color temperature (CCT) range of 2700 K to 6500 K. In one or more embodiments, the composite white light has a TM-30-18 gamut index (Rg) greater than or equal to 100 over the target correlated color temperature (CCT) range of 2700 K to 5000 K. In some embodiments, the composite white light has a gamut index in the range of 95 to 120, or in the range of 100 to 115, over the target CCT of 2700 K to 6500 K.

Certain embodiments of the disclosure are directed to LED devices in which a composite white light has a red spectral component with an excitation purity in the range of 0.8 to 0.9, a green spectral component with an excitation purity in the range of 0.8 to 0.9, a blue spectral component with an excitation purity in the range of 0.4 to 0.5, a color rendering index (CRI) with Ra greater than or equal to 90 and an R9 greater than or equal to 50, and a TM-30-18 gamut index (Rg) greater than or equal to 100 over the target correlated color temperature (CCT) range of 2700 K to 6500 K.

Figure 2A:
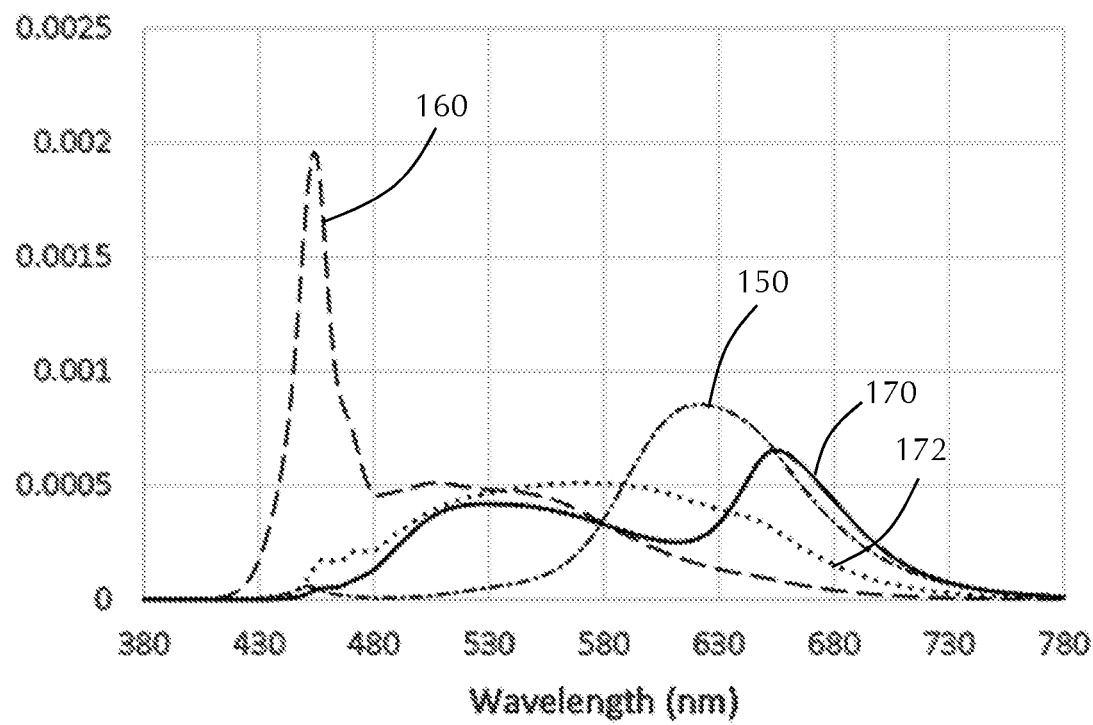
FIG. 2A shows spectra for red, green and blue primaries including a baseline green primary according to one or more embodiment of the disclosure.
Figure 2B:
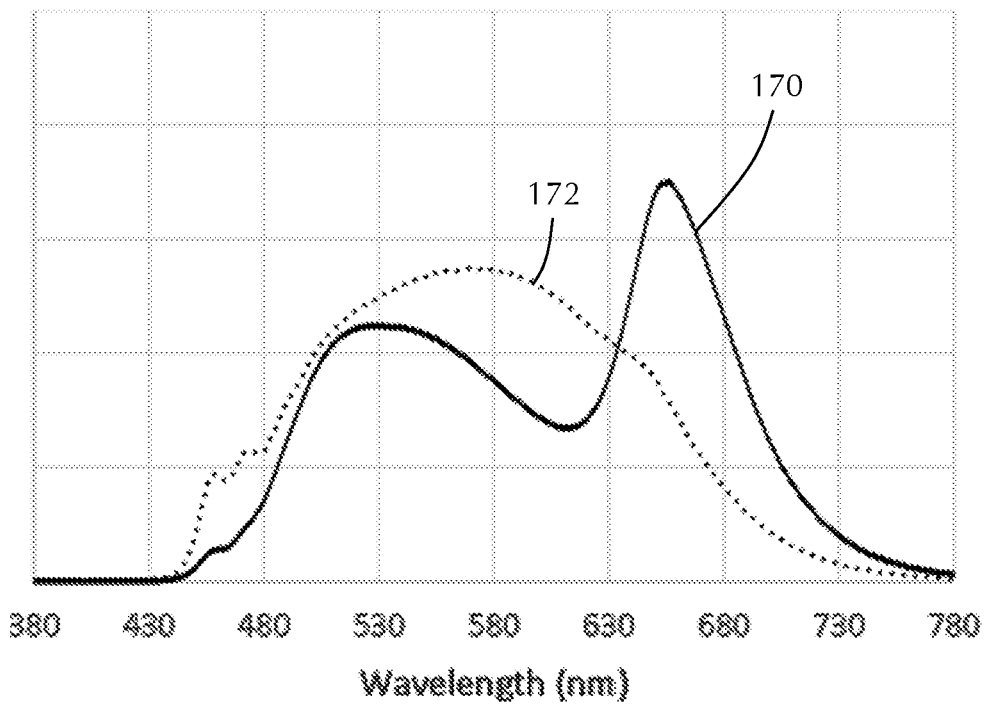
FIG. 2B shows an expanded view of FIG. 2A with the baseline green primary and a sample green primary according to one or more embodiment of the disclosure.

FIG. 2A shows an exemplary composite white light 190 broken out into the corresponding primary spectra of the red spectral component 150, blue spectral component 160 and green spectral component 170 according to one or more embodiment of the disclosure. A baseline green spectral component 172 without the deep red spectral content is included. FIG. 2B shows an expanded view of the green spectral component 170 according to one or more embodiment of the disclosure and a baseline green spectral component 172 without the deep red spectral content.

Figure 3:
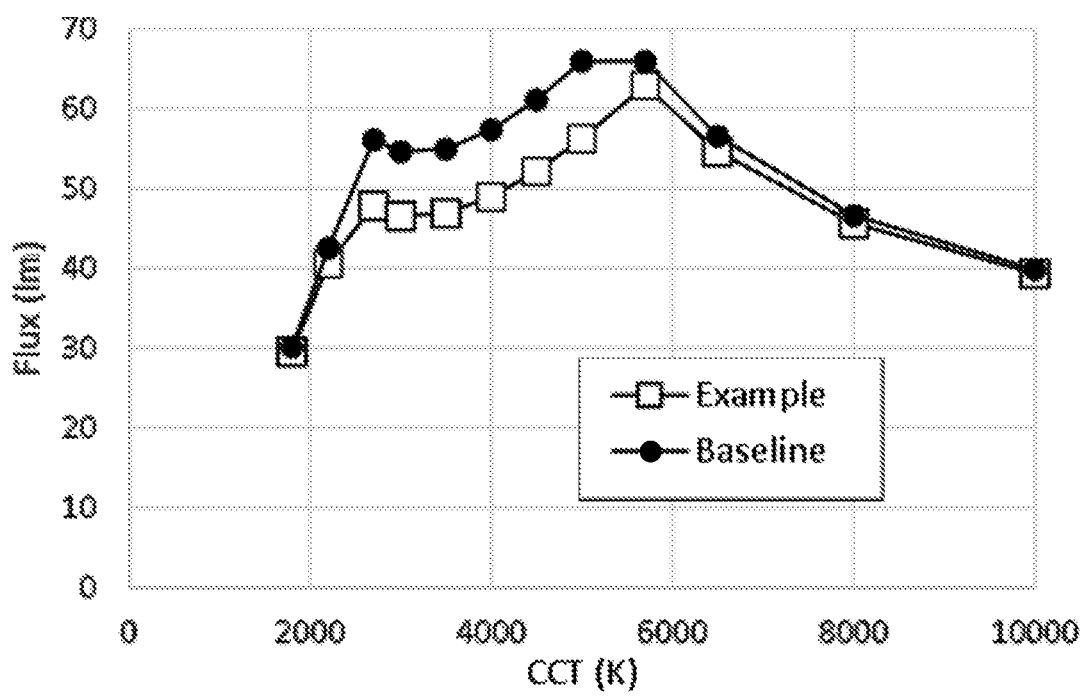
FIG. 3 shows a graph of the normalized flux of composite white light as a function of correlated color temperature (CCT) for baseline and a sample according to one or more embodiment of the disclosure.

FIG. 3 shows a normalized flux of the composite white spectrum as a function of the correlated color temperature (CCT) of a baseline and a sample according to one or more embodiment of the disclosure. The baseline has the same red spectral component 150, blue spectral component 160 and the baseline green spectral component 172, as shown in FIGS. 2A and 2B. The illustrated sample embodiment has the red spectral component 150, blue spectral component 160 and green spectral component 170 illustrated in FIGS. 2A and 2B. The sample has 11% lower flux in the target CCT range compared to the baseline. Without being bound by any particular theory of operation, this is believed to be due to the lower efficacy inherent to the deep red spectral content used to achieve red oversaturation. The color rendering index (CRI) of the sample embodiment has Ra>90 and R9>50, similar to the baseline.

Figure 4:
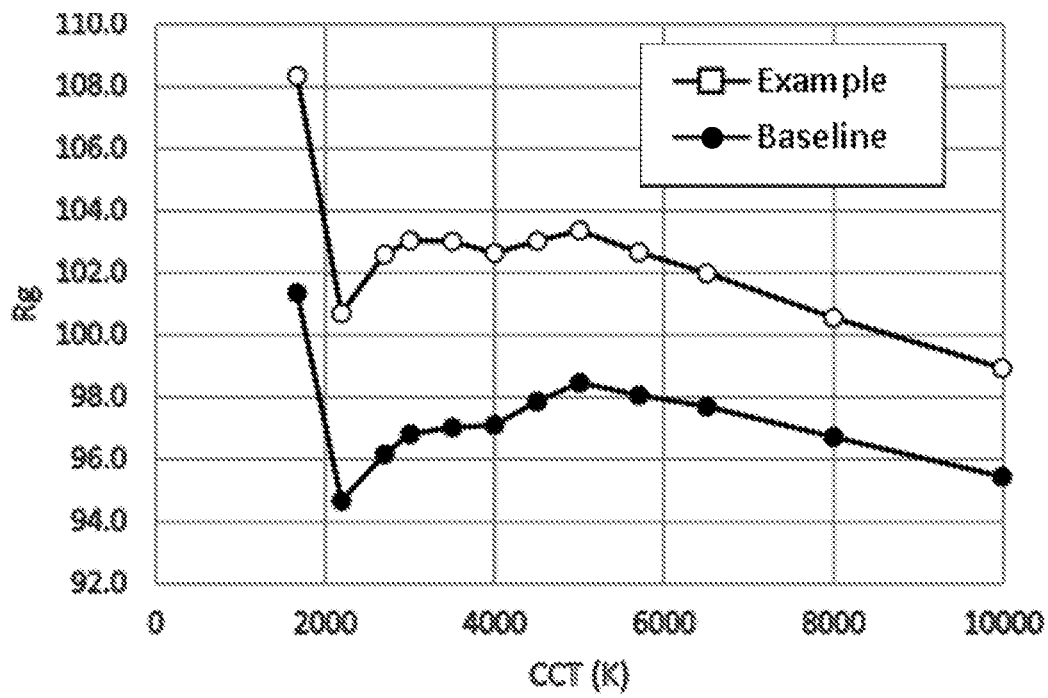
FIG. 4 shows a graph of the TM-30-18 gamut index (Rg) as a function of CCT for baseline and a sample according to one or more embodiment of the disclosure.
Figure 5:
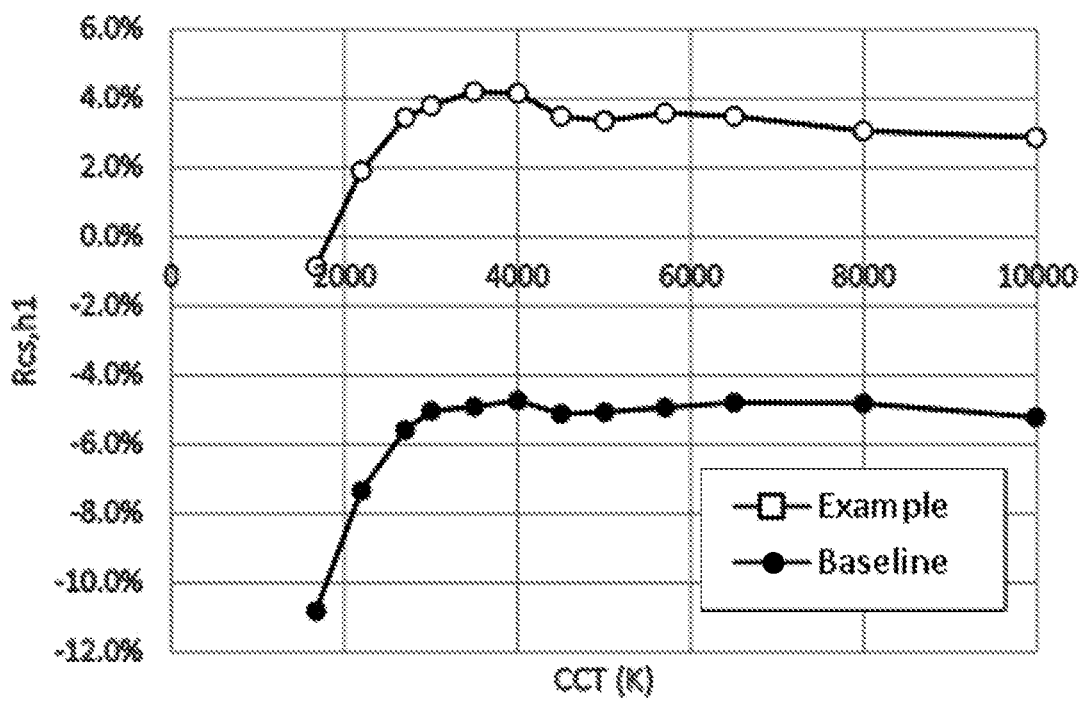
FIG. 5 shows a graph of the TM-30-18 hue bin 1 chroma shift ($R_{cs,h1}$) as a function of CCT for baseline and a sample according to one or more embodiment of the disclosure.

FIGS. 4 and 5 show the TM-30-18 gamut index (Rg) and chroma shift for hue bin 1 ($R_{cs,h1}$) for both the baseline and the sample according to one or more embodiment of the disclosure. As can be seen from these figures, the sample according to an embodiment of the disclosure has an $R_g$>100 and 0%<$R_{cs,h1}$<15% for the targeted 2700-6500K tuning range (and beyond). The baseline sample is not within these subject preference ranges.

Figure 6:
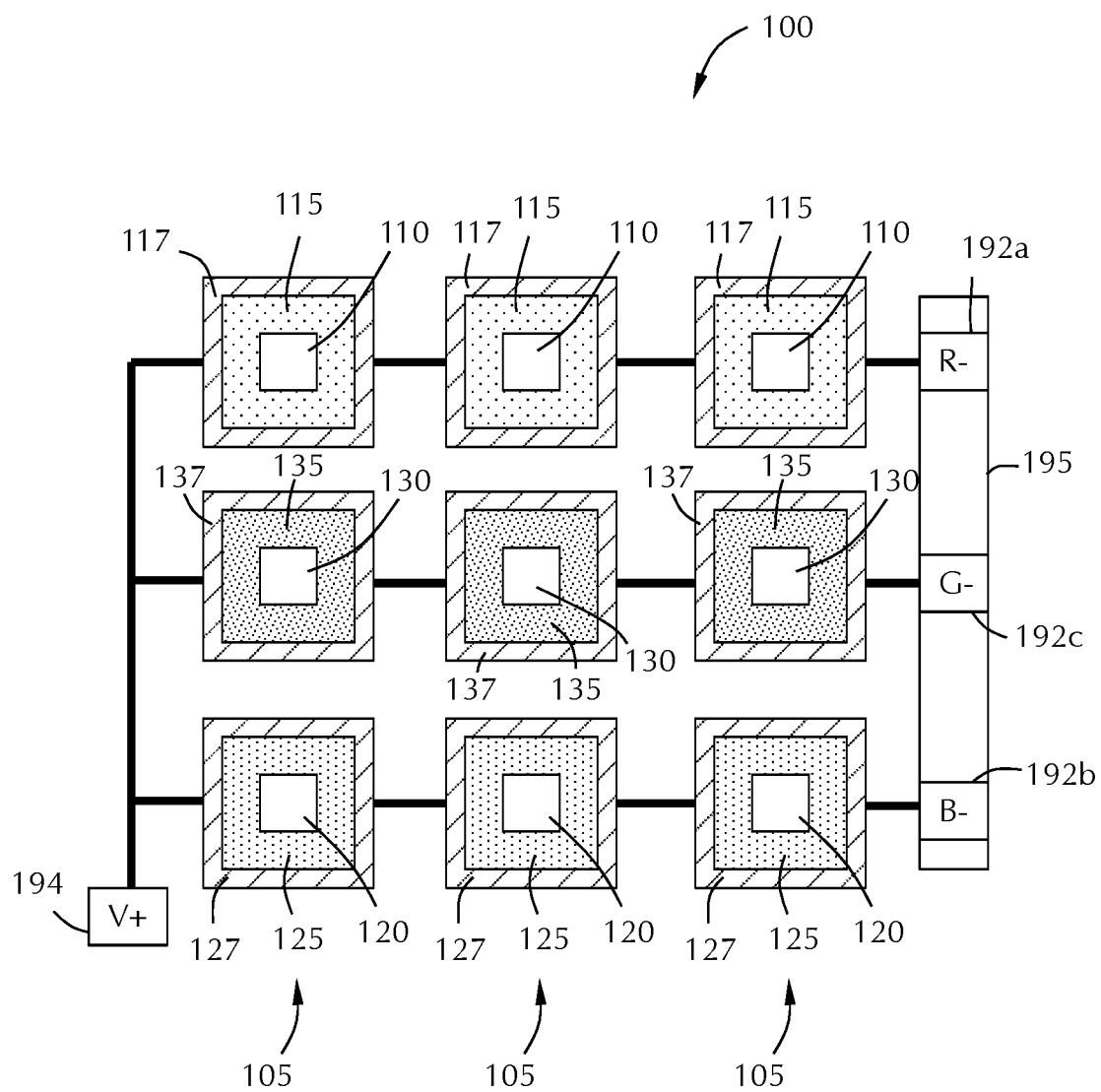
FIG. 6 illustrates an exemplary light emitting device according to one or more embodiment of the disclosure.

Referring to FIGS. 1 and 6, some embodiments of the disclosure are directed to light emitting devices comprising a plurality of RGB LED groups 105. The embodiment illustrated in FIG. 6 has three RGB LED groups 105. Each of the RGB LED groups 105 comprises a first LED 110, a first phosphor 115, a second LED 120, a second phosphor 125, a third LED 130 and a third phosphor 135. Each of the first LED 110 and first phosphor 115 are contained within a first LED package 117. Each of the second LED 120 and second phosphor 125 are contained within a second LED package 127. Each of the third LED 130 and third phosphor 135 are contained within a third LED package 137.

In some embodiments, each of the first LED packages 117 are connected in series, as shown in FIG. 6. In some embodiments, each of the second LED packages 127 are connected in series, as shown in FIG. 6. In some embodiments, each of the third LED packages 137 are connected in series, as shown in FIG. 6. In some embodiments, at least some of the first LED packages 117 are connected in parallel relative to other first LED packages 117. In some embodiments, at least some of the second LED packages 127 are connected in parallel relative to the other second LED packages 127. In some embodiments, at least some of the third LED packages 137 are connected in parallel relative to the other third LED packages 137.

In some embodiments, the first LED packages 117 are connected in series to a controller 195 operating as a controllable anode 192a for the first LED packages. In some embodiments, the second LED packages 127 are connected in series to the controller 195 operating as a controllable anode 192b for the second LED packages. In some embodiments, the third LED packages 137 are connected in series to the controller 195 operating as a controllable anode 192c for the third LED packages. The controller 195 is any suitable control circuit or circuits known to the skilled artisan. In some embodiments, the first LED packages 117 connected in series, the second LED packages 127 connected in series and the third LED packages 137 connected in series share a common cathode 194.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to the terms first, second, third, etc. may be used herein to describe various elements, and these elements should not be limited by these terms. These terms may be used to distinguish one element from another.

Reference throughout this specification to a layer, region, or substrate as being "on" or extending "onto" another element, means that it may be directly on or extend directly onto the other element or intervening elements may also be present. When an element is referred to as being "directly on" or extending "directly onto" another element, there may be no intervening elements present. Furthermore, when an element is referred to as being "connected" or "coupled" to another element, it may be directly connected or coupled to the other element and/or connected or coupled to the other element via one or more intervening elements. When an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A light emitting device comprising:
a first LED and a first phosphor configured to emit solely a red spectral component of a composite white light;
a second LED and a second phosphor separate from the first LED and first phosphor configured to emit solely a blue spectral component of the composite white light; and
a third LED and a third phosphor separate from the first LED and first phosphor and second LED and second phosphor configured to emit a green spectral component of the composite white light, the green spectral component having a first peak wavelength between 500 nm and 580 nm and a second peak wavelength greater than 630 nm and having at least 30% of total radiant flux in a wavelength range of 630 nm to 780 nm.

2. The light emitting device of claim 1, wherein the third phosphor is configured to provide a green spectral component having an Rcs,h1 greater than or equal to −5% by TM-30-18.

3. The light emitting device of claim 1, wherein each of the red spectral component, blue spectral component and green spectral component has an excitation purity less than 0.95.

4. The light emitting device of claim 1, wherein the red spectral component has an excitation purity in the range of 0.8 to 0.94, the green spectral component has an excitation purity in the range of 0.8 to 0.94, and the blue spectral component has an excitation purity in the range of 0.4 to 0.5.

5. The light emitting device of claim 1, wherein the composite white light has a color rendering index (CRI) with Ra greater than or equal to 90 and R9 greater than or equal to 50.

6. The light emitting device of claim 5, wherein the composite white light has a TM-30-18 gamut index (Rg) greater than or equal to 100 over a target correlated color temperature (CCT) range of 2700 K to 6500 K.

7. The light emitting device of claim 6, wherein the composite white light has a TM-30-18 chroma shift for hue bin 1 (Rcs,h1) in the range of 0% to 15% over the target CCT range.

8. The light emitting device of claim 1, wherein each of the first LED, the second LED and the third LED are configured to emit royal-blue light.

9. The light emitting device of claim 8, wherein the red spectral component comprises light having a maximum intensity at a wavelength greater than 600 nm in a wavelength range of 380 nm to 780 nm, and the blue spectral component comprises light having a maximum intensity at a wavelength less than 500 nm in a wavelength range of 380 nm to 780 nm.

10. The light emitting device of claim 1, wherein there are a plurality of RGB LED groups, each RGB LED group comprising the first LED, the first phosphor, the second LED, the second phosphor, the third LED, and the third phosphor.

11. The light emitting device of claim 10, wherein each of the first LED and first phosphor are contained within a first LED package, each of the second LED and second phosphor are contained within a second LED package, and each of the third LED and third phosphor are contained within a third LED package.

12. The light emitting device of claim 11, wherein each of the first LED packages are connected in series, each of the second LED packages are connected in series and each of the third LED packages are connected in series.

13. The light emitting device of claim 12, wherein the first LED packages connected in series, the second LED packages connected in series and the third LED packages connected in series share a common cathode.

14. A light emitting device comprising:
a first LED and first phosphor configured to emit an unsaturated red spectral component of a composite white light;
a second LED and second phosphor separate from the first LED and first phosphor configured to emit an unsaturated blue spectral component of the composite white light; and
a third LED and third phosphor separate from the first LED and first phosphor and second LED and second phosphor configured to emit an unsaturated green spectral component of the composite white light, the third phosphor comprising a green phosphor configured to add deep red spectral wavelengths to light emitted from the third LED, the green spectral component having a first peak wavelength between 500 nm and 580 nm and a second peak wavelength greater than 630 nm and at least 30% of total radiant flux in a wavelength range of 630 nm to 780 nm,
wherein the composite white light has a color rendering index (CRI) with Ra greater than or equal to 90, and a TM-30-18 chroma shift for hue bin 1 (Rcs,h1) in the range of 0% to 15% over a target CCT range of 2700 K to 6500 K.

15. A light emitting device comprising:
a plurality of first LEDs and first phosphors configured to emit a red spectral component of a composite white light, each of the first LEDs connected in series;
a plurality of second LEDs and second phosphors separate from the plurality of first LEDs and first phosphors configured to emit a blue spectral component of the composite white light, each of the second LEDs connected in series;
a plurality of third LEDs and third phosphors separate from the first LEDs and first phosphors and second LEDs and second phosphors configured to emit a green spectral component of the composite white light, the green spectral component a first peak wavelength between 500 nm and 580 nm and a second peak wavelength greater than 630 nm and at least 30% radiant flux present in a wavelength range of 630 nm to 780 nm, each of the third LEDs connected in series; and
a controller configured to independently control an input power for the plurality of first LEDs, the plurality of second LEDS and the plurality of third LEDs.

16. The light emitting device of claim 15, wherein the composite white light has a color rendering index (CRI) with Ra greater than or equal to 90.

17. The light emitting device of claim 15, wherein the composite white light has an excitation purity less than 0.95 for the red spectral component, blue spectral component and green spectral component.

18. The light emitting device of claim 15, wherein the red spectral component has an excitation purity in the range of 0.8 to 0.94, the green spectral component has an excitation purity in the range of 0.8 to 0.94, and the blue spectral component has an excitation purity in the range of 0.4 to 0.5.

19. The light emitting device of claim 15, wherein the composite white light has an R9 greater than or equal to 50.

20. The light emitting device of claim 15, wherein the composite white light has a TM-30-18 gamut index ($R_g$) greater than or equal to 100 over a target CCT range of 2700K to 6500 K, a chroma shift for hue bin 1 (Rcs,h1) in the range of 0% to 15% over the target CCT range.

* * * * *